(12) United States Patent
Pauls et al.

(10) Patent No.: US 9,939,730 B2
(45) Date of Patent: Apr. 10, 2018

(54) OPTICAL ASSEMBLY

(71) Applicant: Carl Zeiss SMT GmbH, Oberkochen (DE)

(72) Inventors: Walter Pauls, Huettlingen (DE); Hendrik Wagner, Aalen (DE); Florian Ahles, Aalen (DE); Christian Wald, Aalen (DE); Steffen Fritzsche, Aalen (DE); Norbert Wabra, Werneck (DE); Boris Bittner, Roth (DE); Sonja Schneider, Oberkochen (DE); Ricarda Schoemer, Zusmarshausen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 67 days.

(21) Appl. No.: 14/962,149

(22) Filed: Dec. 8, 2015

(65) Prior Publication Data

US 2016/0091798 A1    Mar. 31, 2016

Related U.S. Application Data

(63) Continuation of application No. PCT/EP2014/065357, filed on Jul. 17, 2014.

(30) Foreign Application Priority Data

Jul. 17, 2013 (DE) ........................ 10 2013 214 008

(51) Int. Cl.
*G03B 27/42* (2006.01)
*G03F 7/20* (2006.01)

(52) U.S. Cl.
CPC ........ *G03F 7/70058* (2013.01); *G03F 7/7085* (2013.01); *G03F 7/70258* (2013.01)

(58) Field of Classification Search
CPC ............... G03F 7/70058; G03F 7/7085; G03F 7/70258; G03F 7/70775; G03F 7/70916;
(Continued)

(56) References Cited

U.S. PATENT DOCUMENTS

| 8,339,577 B2 | 12/2012 | Xalter et al. |
| 2003/0179357 A1 | 9/2003 | Ravensbergen |

(Continued)

FOREIGN PATENT DOCUMENTS

| DE | 10 2005 062 038 | 6/2007 |
| DE | 10 2009 019 254 | 6/2010 |
| WO | WO 2011/039036 | 4/2011 |

OTHER PUBLICATIONS

International Search Report and Written Opinion for corresponding PCT Appl No. PCT/EP2014/065357, dated Oct. 23, 2014.

*Primary Examiner* — Mesfin Asfaw
(74) *Attorney, Agent, or Firm* — Fish & Richardson P.C.

(57) ABSTRACT

An optical assembly, in particular for a lithography system for imaging lithographic micro- or nanostructures, includes at least two optical elements arranged successively in a beam path of the optical assembly, an acquisition device designed to acquire radiation signals from marking elements on or at the at least two optical elements, and a control device coupled to the acquisition device and which is designed to determine the plurality of properties of the optically active surface of the at least two optical elements as a function of the information contained in the radiation signals originating from the marking elements. The disclosure also relates to a method for operating the optical assembly.

31 Claims, 7 Drawing Sheets

(58) Field of Classification Search
CPC .......... G03F 7/20; G03F 7/70; G03F 7/70875; G03F 7/706; G03F 7/70758; G03F 9/7076; G03F 7/70925; G03F 1/42; G03F 1/44; G03F 7/201; G03F 7/24; G03F 7/70891; G03F 7/7095
See application file for complete search history.

(56) References Cited

U.S. PATENT DOCUMENTS

| | | |
|---|---|---|
| 2004/0227102 A1 | 11/2004 | Kurt et al. |
| 2007/0273851 A1* | 11/2007 | Finders ................ G03B 27/522 355/30 |
| 2009/0002663 A1 | 1/2009 | Freimann et al. |
| 2009/0231707 A1 | 9/2009 | Ehm et al. |
| 2011/0188011 A1 | 8/2011 | Ehm et al. |

* cited by examiner

OPTICAL ASSEMBLY

CROSS-REFERENCE TO RELATED APPLICATIONS

The present application is a continuation of, and claims benefit under 35 USC 120 to, international application PCT/EP2014/065357, filed Jul. 17, 2014, which claims benefit under 35 USC 119 of German Application No. 10 2013 214 008.8, filed Jul. 17, 2013. The entire disclosure of international application PCT/EP2014/065357 is incorporated by reference herein.

FIELD

The disclosure relates to an optical assembly, in particular for a lithography system for imaging lithographic micro- or nanostructures. The disclosure additionally relates to a method for operating the optical assembly.

BACKGROUND

An optical assembly in this context is understood to mean an assembly including a plurality of optical elements, for example mirrors or lens elements, which direct light or other radiation. In this case, the light or the radiation is focused or scattered, for example. Optical assemblies can be used for diverse purposes. Inter alia, they can be used as illumination systems in a lithography system. In such an illumination system, light is generated for later processing or use in a downstream portion of the lithography system.

Optical assemblies can also be used in the context of lithography systems in a subsequent step for producing integrated circuits or other micro- or nanostructured components. In this case, structured layers are applied to a substrate, such as a wafer, for example, wherein the layers, for structuring purposes, are firstly covered with a photoresist that is sensitive to radiation in a specific wavelength range. In particular, light or radiation in the deep ultraviolet (DUV: deep ultraviolet, VUV: very deep ultraviolet) or in the far, extreme ultraviolet spectral range (EUV: extreme ultraviolet) is used at present. The wafer coated with photoresist is exposed by an exposure apparatus, which can likewise be an optical assembly. In this case, a pattern of structures that is produced on a mask or a reticle is imaged onto the photoresist with the aid of a projection lens. Reflective optical units, for example, are used for this purpose. After the photoresist has been developed, the wafer is subjected to chemical processes, as a result of which the surface of the wafer is structured in accordance with the pattern on the mask. Further steps can follow until all layers have been applied to the wafer for forming the semiconductor structure.

The lithography system has a device for generating light or an illumination system and an optical imaging system, both of which can constitute a so-called optical assembly. In order to illuminate the wafer, firstly light is generated in the device for generating light, the light then being directed onto the wafer through or in the optical imaging system. Within the optical imaging system, also called projection assembly, optical units or optical elements are used in order to direct the light generated by the device for generating light onto the wafer. The optical units can be mirrors, for example. In order to ensure a precise imaging of the structures onto the wafer, firstly a precise alignment of the mirrors with respect to one another is desired. Secondly, it is desirable to be able to check and, if appropriate, correct the optical properties of the mirrors.

It is possible, for example, for imaging aberrations to arise as a result of the absorption of the projection light in the lens elements or mirrors or optical elements forming the optical system. Light-induced effects, such as nonuniform heating, can lead to local variations of optical properties of the optical elements. By way of example, increasing EUV powers provide for higher absorption loads on the optical elements and thus lead to larger temperature gradients. In order to be able to avoid or at least to be able to detect variations of optical properties brought about as a result, the optical elements can be monitored in a spatially and temporally resolved manner. A multiplicity of cable-based temperature sensors on the mirror rear side are usually used for this purpose. In this case, the spatial resolution correlates with the number of temperature sensors used. However, the cables used produce a dynamic short circuit between the mirror and a frame of the apparatus. Furthermore, the use of a large number of temperature sensors on or within the optical element places stringent demands on mirror manufacture and entails a certain risk of failure for the entire mirror, since the positions of the sensors are directly in proximity to the optically effective surface.

Furthermore, contaminants, in particular macroscopic contaminants, i.e. those having orders of magnitude of between a few μm and a few mm, on the mirror surface can alter the optical properties. Typical types of contamination are dust particles. Hitherto there has not been any possibility of ascertaining macroscopic contaminants on mirror surfaces individually for each mirror during operation. A decrease in the total transmission and in the optical power of the system heretofore has involved switching off the system in order to examine the mirror surfaces. Such contaminants can arise as a result of dust, outgassing from materials or the like.

Stray light in the projection system can likewise influence the optical properties of the mirrors, since it can lead to harmful light on the wafer, which can lead to a loss of contrast, for example. It is often desirable to acquire the temporal development of the stray light in order to be able to identify possible degradation effects at an early stage, in a similar manner to that in the case of the contamination changes.

The properties of the optical elements, in both illumination and imaging systems, can be further influenced by the position of the mirrors, which should therefore be checkable. Sensors are currently used for determining the absolute mirror position. On the basis of these mirror positions, the mirrors are brought from the end stop position, for example after the system has been switched off or after an initialization, approximately to their original position again. For this purpose, it is possible to use actuators, for example manipulators, which are present in the system in order to move the mirrors. However, the zero position of these sensors has an undesirable tendency toward drift, as a result of which the measurement of the position can become inaccurate over time.

Further properties of the optical elements concern the position and alignment within an optical assembly. At present there are no methods that can be used to directly determine the relative position of the optical surfaces of mirrors with respect to one another in an EUV projection system. It is particularly desirable to have knowledge of the position and the alignment of the optical mirror surfaces as early as in the construction of the lens during mounting. In this way, already at a very early point in time a first coarse optimization of the optical aberrations could be performed via corresponding mirror positionings. Hitherto, complex wavefront measurement techniques have been used for this purpose, the position and alignment of individual mirrors remaining unknown, however. The position and the alignment of the optical mirror surfaces are determined indirectly during mounting, for example, by CAA vectors (computer added alignment) of mirrors being measured prior to mounting and being taken into account computationally with locations or positions of manipulators at this point in time. Manipulators are used to alter the alignment and the position of the mirrors, the range in which the manipulators can act being limited. Since the manipulator travels are restricted, it would be desirable to be able to achieve a coarse adjustment as early as during mounting, in order to be able to use the restricted manipulator travels only for fine adjustment.

U.S. Pat. No. 8,339,577 B2 discloses an illumination system for a microlithographic assembly in which, inter alia, the alignment of mirror elements within a multi-mirror array can be determined. In this case, a luminous pattern is reflected by the multi-mirror array and acquired with the aid of a camera. One possibility for determining the position of mirrors with respect to one another is described in WO 2011/039036 A2, in which measurement sections which are defined between the mirrors and within which light passes are used to carry out an interferometric measurement.

However, measures for making it possible to determine various properties of the optical elements and the position of the optical elements within an optical assembly in a simple manner would be desirable.

SUMMARY

Against this background, the disclosure provides an optical assembly with which various properties of the active region of one or a plurality of optical elements can be determined in a simple and efficient manner.

Accordingly, an optical assembly, in particular for a lithography system for imaging lithographic micro- or nanostructures, is proposed. The optical assembly includes at least two optical elements arranged successively in a beam path of the optical assembly (100), and an acquisition device designed to acquire radiation signals from marking elements on or at the at least two optical elements, the marking elements being fitted outside of optically active regions of the at least two optical elements. In this case, the acquisition device is arranged outside a beam path between a first optical element and a last optical element of the at least two optical elements. The radiation signals contain information about a plurality of properties of an optically active surface of the at least two optical elements. Furthermore, the optical assembly includes a control device, which is coupled to the acquisition device and which is designed to determine the plurality of properties of the optically active surface of the at least two optical elements as a function of the information contained in the radiation signals originating from the at least two optical elements and/or the marking elements.

In accordance with a further aspect, a method for operating such an optical assembly is proposed. The method includes the following steps:

providing at least two optical elements, in particular for imaging lithographic micro- or nanostructures, wherein the at least two optical elements are arranged successively in a beam path of the optical assembly (100);

acquiring radiation signals from marking elements on or at the at least two optical elements, the marking elements being fitted outside of optically active regions of the at least two optical elements, wherein the radiation signals contain information about a plurality of properties of an optically active surface of the at least two optical elements; and determining the plurality of properties of the optically active surface of the at least two optical elements as a function of the information contained in the radiation signals originating from the at least two optical elements and/or the marking elements.

Positioning the optical elements can be carried out in a further step of the method. In this case, the optically active surfaces of the at least two optical elements can be aligned relative to one another. Preferably, the latter are in this case brought as near as possible to their design positions. The positioning of the optical elements can take place progressively, for example proceeding from the first optical element in the beam path or from the last optical element in the beam path. Design positions in this context relate to the respective position of the optical element such as was originally intended in the design of the assembly. Alternatively, this positioning can be carried out instead of determining the one or the plurality of properties of the optically active surface of the at least two optical elements.

The optical assembly is based on the concept of determining properties of one or a plurality of optical elements without influencing the optical elements. This is achieved, inter alia, by virtue of the fact that no sensors are desired on the optical elements. The acquisition device can acquire properties of the optical elements either directly on the basis of radiation signals from the latter or indirectly via marking elements on or at the optical elements. Further sensors are not required, but could likewise be used.

The optical assembly can be used for example as a projection assembly for imaging patterns or structures onto a wafer. Another application possibility is the use as a light generating or illumination system.

At least two optical elements can be present in the optical assembly. Such an optical assembly usually includes a multiplicity of optical elements, for example four to eight optical elements. The optical elements are arranged successively within the optical assembly in the beam path of used light. The optical elements have an optically active region formed on a top side of the optical elements. This surface or the optically active region can be a reflective or refractive or diffractive surface, for example a mirror surface.

The acquisition device can acquire radiation signals emitted either from one of the optical elements or the optically active region of the optical elements or from marking elements fitted on or at the optical elements. Emission of the radiation signals can include reflection or diffraction of radiation signals from other sources, as will be explained in greater detail in connection with exemplary embodiments. The radiation signals include information describing spatially resolved properties of one or a plurality of optical elements. The radiations designated as radiation signals can be signals which are independent of the imaging or generated light, i.e. used light, and which can differ from the used light for example also in terms of the wavelength used. In this way, the acquisition device can acquire radiation signals if used light is present at the same time. However, the radiation signal acquired by an acquisition device can also originate from the used light, for example as stray light. The radiation signals are acquired in particular in a spatially resolved fashion.

The marking elements can be active or passive marking elements. Passive marking elements are understood to mean elements which do not actively generate radiation signals, but rather merely reflect incident light, for example. Active marking elements, by contrast, actively generate radiation signals, for example by diffraction or refraction or with the aid of a light source. This can be carried out by excitation via an optical signal, such as from a light source. Exemplary embodiments of active marking elements will be explained in even greater detail below. It is also conceivable for active marking elements to bring about a shift in wavelength of incident light or radiation and for the wavelength-converted light to be able to be acquired. When the marking elements are fitted outside the optically active regions of the at least two optical elements, the operation of the optical assembly is not influenced by this fitting. On the one hand, the marking elements can be used during the operation of the optical assembly; on the other hand, the marking elements do not have to be deactivated or removed for the operation of the optical assembly.

Since the acquisition device is arranged outside the beam path between the first optical element and the last optical element, properties can be ascertained in the course of operation as well. The function of the optical assembly is not influenced by this.

In this case, "first optical element" denotes that optical element in the optical assembly on which used light is incident first. This can be, for example, imaging light generated by the light generating device. In this case, "last optical element" denotes that optical element in the optical assembly on which the used light is incident last before being forwarded, for example being guided as imaging light to the wafer. Further optical elements, each of which forwards the used light, can be arranged between the first optical element and the second optical element. That region within the assembly in which the used light moves is designated as beam path, wherein an entire beam path includes all regions from the entrance to the exit of the used light. The beam path can include the region within the assembly from the entrance of the imaging light to the wafer. The beam path is nondirectional, i.e. without a direction, and only defines the region in which the used light passes. The actually optically used region, the so-called footprint, can be smaller or narrower than the region of the optical surfaces of the optical elements. The acquisition device should preferably be arranged outside the footprint in order not to influence the optically used region.

The control device can be any type of microchip suitable for carrying out the determination of the properties. The coupling between the acquisition device and the control device can be effected via various types of coupling apparatuses. By way of example, optical waveguides can be used in order to transmit the acquired radiation signals to the control device. On the basis of the radiation signals or the information contained in the radiation signals, the control device determines one or a plurality of properties of the optically active surface of the optical elements in a spatially resolved fashion. In this case, the properties of one or a plurality of optical elements can be determined, for example sequentially in one embodiment. In addition to the spatially resolved determination, a temporally resolved determination can also be effected, if for example a variation or monitoring over time is intended to be effected.

The properties ascertained by the control device can be used as input signal(s) for a control loop in order to adapt the properties of the optical elements.

In accordance with one embodiment, the radiation signals contain optical information, temperature information and/or position information.

Temperature information can be used for determining the temperature distribution on the optically active region of the optical elements. For the purpose of monitoring the temperature, the temperature can be measured or ascertained over a specific period of time. The temperature distribution can include, for example, information about a nonuniform illumination, absorption of light, and thus heat, at contaminants, inhomogeneous coating or else an image representation of the structures.

The position information can describe a position of the optical element or elements within the optical assembly, for example as an absolute position relative to a reference position. The position information can also include information about the alignment or situation of the optical elements with respect to one another.

The optical information can include for example information about stray light on the optically active region of one or a plurality of optical elements. On the basis of the stray light information, by way of example, contaminations, that is to say contaminants or damage, of the optically active regions can be determined. Furthermore, the position or alignment of the optically active surfaces relative to the other surfaces can be determined. The radiation signals can likewise be used for this purpose.

In accordance with a further embodiment, the optical assembly furthermore includes at least one holding apparatus, which at least partly encloses the beam path, wherein the acquisition device is fitted to the holding apparatus outside the beam path; in particular, the acquisition device has a plurality of sub-acquisition devices fitted to the holding apparatus outside the beam path.

The holding apparatus can be a frame which is already present and which at least partly encompasses the beam path. Depending on the embodiment, the entire beam path from the entrance to the exit of the used light, i.e. for example all regions from the entrance of the imaging light to the wafer, can be encompassed by the holding apparatus. By way of example, the holding apparatus can be a metal tube that encloses the beam path in a light-tight fashion. This is also referred to as a "mini-environment". The acquisition device is arranged outside this holding apparatus. No further camera mounting apparatuses are desired. Furthermore, fixing of the acquisition device or of the sub-acquisition devices without mechanical coupling to the optical elements is made possible in this way. In contrast thereto, sensors fixed on or at the optical elements would involve cables leading away from the latter, as a result of which a mechanical coupling would be present.

The sub-acquisition devices can be fitted to different regions of the holding apparatus. Preferably, the holding apparatus encompasses the beam path closely, for example to a few millimeters. A spatially flexible fitting of the sub-acquisition devices is possible in this way. The sub-acquisition devices can thus be aligned in a simple manner with the source of the radiation signals to be acquired. The holding apparatus can consist of a plurality of parts, wherein each optical element can have a part of the holding apparatus for delimiting or enclosing the beam path.

If a higher spatial resolution is desired, the number of sub-acquisition devices can be correspondingly increased.

In accordance with a further embodiment, the holding apparatus has openings through which the sub-acquisition devices acquire radiation signals from the respective optical element and/or from marking elements on the respective optical element.

If the intention is to acquire the optically active region or marking elements within the holding apparatus, the sub-acquisition devices can be aligned with the corresponding regions on the optically active region through the openings. As a result of the arrangement of the sub-acquisition devices in the openings, the holding apparatus can nevertheless close up the beam path in a light-tight fashion.

In accordance with a further embodiment, the sub-acquisition devices are arranged outside the beam path between the optically active regions of the at least two optical elements.

The sub-acquisition devices can be arranged outside the entire beam path. In any case they are arranged outside the beam path between the first and last optical elements.

In accordance with a further embodiment, the holding apparatus has cooled regions.

The holding apparatus can be used for cooling the optical elements. Since the sub-acquisition devices can be fixed to the holding apparatus, heat generated by the sub-acquisition devices can be dissipated directly. For this purpose, it is possible to use cooling elements that dissipate the heat from the holding apparatus.

In accordance with a further embodiment, the sub-acquisition devices are fitted to one or a plurality of cleaning heads, in particular hydrogen cleaning heads.

Cleaning heads are used to clean the optically active regions. In this case, by way of example, atomic hydrogen is applied to the surface of the optical element via a gas jet. By virtue of the sub-acquisition devices being fitted to cleaning heads that are already present, a further fitting apparatus is unnecessary.

In accordance with a further embodiment, the acquisition device has a camera, in particular an infrared camera, and/or an optical waveguide for acquiring and/or forwarding the radiation signals.

A camera can be used to optically acquire the radiation signals. If a temperature distribution is intended to be ascertained, it is possible to use an infrared camera which can record an infrared image of the optical element.

Instead of cameras, optical waveguides, such as optical fiber light guides, for example, in combination with spatially separated CCD camera optical units can also be substituted. In this case, the signal fed into the optical waveguides can be transferred over a spatial distance, as a result of which the positioning of the CCD camera optical unit is more freely selectable. As a result of the use of optical waveguides and their positioning possibilities optimized in terms of structural space, the number of sub-acquisition devices can be increased in comparison with the use of cameras. Furthermore, as a result of the flexible positioning, the heat generated by the CCD cameras can be kept away from the optical elements.

By way of example, silicon fibers can be used as materials for optical waveguides, which fibers can be used in particular for wavelengths of less than 2 µm. Chalcogenide fibers, for example, can be used for longer wavelengths.

In accordance with a further embodiment, the acquisition device is designed to acquire radiation signals in the infrared range, in particular having a wavelength of between 600 nm and 30 µm, in particular 600 nm to 1000 nm, 1 µm to 10 µm, and/or 10 µm to 30 µm, and/or in the ultraviolet range, in particular having a wavelength of between 10 nm and 400 nm, in particular 100 nm to 300 nm, in particular 200 nm to 280 nm.

Depending on the property to be determined, it is possible to use different types of acquisition devices geared to different wavelengths. In this regard, for measuring the temperature distribution, for example, it is possible to use infrared cameras which can acquire radiation signals in the infrared range. For identifying contaminants it is possible to use cameras which can acquire radiation signals in the ultraviolet range, in particular in the DUV range, since stray light originating from the used light can be acquired in order to identify contaminants.

Infrared cameras operating at a wavelength corresponding to the maximum of the spectral distribution of the mirror surface temperature are suitable for a temperature measurement.

As a result of Planck's radiation law for a black body, wavelengths to be detected of between 2 µm and 20 µm arise at a typical operating temperature. Stray signals in the ultraviolet spectrum, i.e. between 100 nm and 300 nm, can be detected for a stray light measurement.

For ascertaining contaminants, the acquisition device can have a camera which acquires a reflected signal having a specific polarization. A measurement method that can be used here is ellipsometry, for example, via which carbon contaminants of the optical elements can be determined. In this case, the optical elements are irradiated with linearly polarized light and the reflected light is acquired as radiation signals by the acquisition device. Afterward, the polarization state of the reflected light is determined and a change in the polarization state in comparison with the irradiation light is examined. A contaminant of the surface of an optical element, for example a carbon contamination, can be ascertained on the basis of the change. This is also referred to as ellipsometric measurements.

In accordance with a further embodiment, the at least two optical elements each have at least one marking element, wherein the marking elements emit the radiation signals to be acquired.

A position determination can be implemented as a result of the fitting of suitable marking elements or structures on mirrors, in particular outside the used light region. A three-dimensional position determination can be realized via the marking elements, as a result of which the sensors required heretofore can be avoided. Embodiments of the marking elements are explained in greater detail below and in the figures.

In accordance with a further embodiment, the marking elements each have a diffractive and/or scattering and/or reflective structure.

The marking elements or the structures thereof can consist of thin layers. The latter can be structured for example with the aid of electron or other particle beams. The marking elements or the structure that outputs the radiation signal to be acquired constitute(s) locations on the optical elements whose position is fixed.

In accordance with a further embodiment, the acquisition device has a light source in order to illuminate the marking elements, and wherein the acquisition device is designed to receive a radiation signal emerging from the marking elements.

In accordance with this embodiment, the marking elements have a reflective structure in order to be able to reflect the light or other radiation from the acquisition device. A position determination, for example, can be carried out in this way.

In accordance with a further embodiment, the control device is coupled to the marking elements.

The control device can control the marking elements, such that the latter generate radiation signals. In this way, it is also possible for the marking elements to be switched on and off by the control device.

In accordance with a further embodiment, the acquisition device has at least two sub-acquisition devices with a light source, wherein the radiation signals emerging from the light sources cross one another and respectively irradiate marking elements of an optical element.

By virtue of this arrangement, other properties can also be ascertained in addition to the position determination. The sub-acquisition devices are aligned here not only with the marking elements, but also with the optically active region of the optical elements as a result of the crossing or intersection of the radiation signals. In this way, other properties such as temperature distribution or presence of stray light can also be determined at the same time. For this purpose, the sub-acquisition devices can have acquisition elements for different wavelengths.

In accordance with a further embodiment, at least one selection of the optical elements has at least two marking elements, in particular three marking elements.

A higher number of marking elements can increase the spatial resolution. A different number of marking elements may also be preferred depending on the type of measurement. It is also possible for one portion of the marking elements to be used for a first measurement method and another portion of the marking elements to be used for a second measurement method. The various possibilities of the measurement methods will be explained in even greater detail below.

One example of a possible measurement method is ascertaining the light cones or CCD conic sections. In this case, a marking element emits a light cone. For a measurement, the light emitted by the marking element is imaged onto a CCD chip (acquisition device with control device) of the measurement system. In this case, the CCD chip detects the corresponding conic section. The position of the marking elements can be deduced from a plurality of different detected conic sections. In particular, the evaluation of the ellipticity of the conic sections yields a measurement value for the tilting of the mirror. That means that, the more circular the conic section, the more parallel the mirror is aligned with the detection device. The accuracy of this method can be improved via a calibration measurement—preceding the actual measurement—of the mirror surface with respect to the marking elements, for example at a mirror-specific measurement station. In an extended configuration, the light cones can be varied with the aid of a suitable attachment optical unit (zoom optical unit) and/or stop. This serves to increase the accuracy of the determination of the position of the marking elements.

In a further possible embodiment, instead of light cones having a circular base area, light cones having an elliptical base area can also be emitted via a suitable attachment optical unit and/or stop. The measurement accuracy can be improved further via this variation.

A further example of a measurement method is time-of-flight measurement. This measurement technique is based on the accurate measurement of the time of flight t of the light in order, with knowledge of the speed of light c in the medium under consideration, where n represents the refractive index, to deduce the absolute position s of the mirror or optical element to be measured:

$$t = \frac{2s \times n}{c}$$

In this case, on account of the reflection at the marking elements, the light covers twice the distance s, i.e. from the acquisition device with light source to the corresponding marking element and back again to the acquisition device. For the coarse adjustment of the distances of the optical elements of the order of magnitude of accuracy of approximately 5 μm, for example the underlying time measurement would have to have an accuracy of at least $$\Delta t = \frac{\Delta 2s \times n}{c} = \frac{2 \times 5 \times 10^{-6} \text{ m}}{3 \times 10^8 \text{ ms}^{-1}} \approx 33 \, fs$$

In order to be able to measure these extremely short times, the wave that is emitted and returned again in a reflected fashion is compared with an internal reference signal. This measurement methodology uses the principle of frequency combs and phase comparison.

In accordance with a further embodiment, the at least two marking elements produce different wave shifts of the incident light.

The marking elements can be distinguished by the different wave shifts. In this way, the positions of the marking elements on the optical elements can be identified in a simple manner. By way of example, wavelength converters can be used as marking elements.

In accordance with a further embodiment, the at least two marking elements are arranged in such a way that the radiation signals output by the at least two marking elements interfere.

In accordance with this embodiment, a further measurement method can constitute an interferometric measurement. In this embodiment, the relative position of two marking elements fitted on an optical element is determined by examining the interfering radiation signals. This is explained in even greater detail below.

In accordance with a further embodiment, the at least two marking elements have a jointly used scattering structure and a jointly used diffractive structure and in each case an individually used diffractive structure, wherein radiation signals are transferred from the jointly used scattering structure to the jointly used diffractive structure, wherein the jointly used diffractive structure is designed to transfer the radiation signals in each case to one of the individually used diffractive structures of the at least two marking elements.

This arrangement of the diffractive and scattering structures affords the advantage that only one scattering structure has to be impinged on by radiation signals. A plurality of marking elements can be realized as a result of the subsequent arrangement of individually used, i.e. separate, diffractive structures.

For the interferometric measurement, the jointly used scattering structure is illuminated with a suitable wavelength. The jointly used diffractive structure is fitted directly to the jointly used scattering structure and has an order of diffraction k that is determined by the equation $$\sin \alpha = \frac{k\lambda}{g}$$

wherein g represents a suitably chosen grating constant and α represents the diffraction angle. The orders of diffraction k=±1 impinge on the individually used diffractive structures, which is achieved by suitable positioning of the structures and choice of the grating constants. The diffractive structures in turn generate diffraction spectra which can be detected via a suitable optical unit and a CCD camera with sufficiently good spatial resolution. The relative position of the structures and thus the absolute position of the optical element can be determined by the mutual positioning of the orders of diffraction generated by the structures.

In accordance with a further embodiment, the marking elements each have a scattering structure and a diffractive structure, wherein the scattering structure is arranged on an underside of the respective optical element, the diffractive structure is arranged on that side of the optically used region of the optical element which is situated opposite the underside, and radiation signals are transferred from the scattering structure to the diffractive structure through the optical element.

In accordance with this embodiment, the optical element is likewise transparent to the wavelength of the radiation signals from the scattering structure to the diffractive structure. Each scattering structure can be impinged on by radiation signals, for example via a light source. The diffractive structure is arranged in such a way that the radiation signals output by this structure are directed onto the acquisition device.

In accordance with a further embodiment, a marking element has a scattering structure and a stop, wherein radiation signals are directed through the scattering structure and the stop onto a coating-free region of the respective optical element.

A further example of a measurement method which can be carried out with this embodiment is the location-angle measurement. The marking elements are designed such that the scattering structure situated on the mirror rear side acts as a point light source, the light from which is collimated by the structure or stop situated on the mirror front side to form a light beam. The scattering structure can itself have a very small extent or be followed by a stop having a small diameter (between 10 µm and 100 µm) in order to constitute a point light source.

The principle of the location-angle measurement is employed for measuring the collimated light beams. In this case, both a point of incidence (location) on the acquisition device and the direction (angle) from which the beam comes are determined from the collimated light beam. If at least two (non-parallel) light beams are then emitted by the optical element and are incident on the acquisition device, which can be a location-angle sensor in this case, via an evaluation algorithm it is possible to reconstruct the light beams in space and thus to ascertain the position of the optical element.

In accordance with a further embodiment, the scattering structure is irradiated by a light source.

The light source can be an LED light source, for example. Other types of light sources are also possible. The light source need not be positioned precisely, since the scattering structure serves as a secondary light source, the position of which is fixed.

In accordance with a further embodiment, the diffractive structure is formed in a mirror surface of the optical element, in particular by a material removal that can be carried out for example by etching, engraving, laser treatment, grinding, irradiation and the like.

The diffractive structure can also be produced by other types of surface treatment. Instead of a direct alteration of the surface, the diffractive structure can also be applied as a thin layer.

In accordance with a further embodiment, the mirror surface is locally curved in order to form a lens element.

In accordance with this embodiment, a lens element or diffractive structure is achieved by curvature of the mirror surface. In addition, part of the surface can be uncoated in order to enable radiation signals to pass through.

In accordance with a further embodiment, the acquisition device is designed to acquire radiation signals having a wavelength of between 193 nm and 1450 nm, in particular 193 nm to 680 nm.

These wavelengths are usually used in lithography systems. DUV light sources, for example, can have a wavelength of less than 300 nm.

In accordance with a further embodiment, the marking element has a light source.

Instead of the use of different structures which are irradiated by a light source, the marking element itself can have a light source. For this purpose, small light sources such as LEDs can be arranged on the surface of the optical elements.

In accordance with a further embodiment, the marking elements can be switched on and/or off, in particular the marking elements of the at least two optical elements can be switched on and off independently of one another.

In this way, the optical elements can be measured in a time-shifted fashion, for example sequentially. This is desirable in particular in an optical assembly in which a plurality of optical elements are present.

In this way, a selective selection of the optical elements to be measured can also be carried out in addition to a simple position determination. As already explained, the accurate alignment of the optical elements with respect to one another is used for a precise function of the optical assembly. As a result of this embodiment, even in the closed system a detection and measurement of the optical elements independently of one another are possible, since the latter can be successively measured and calibrated on the basis of the results.

In accordance with a further embodiment, the acquisition device is arranged in the beam path to the first optical element or in the beam path from the last optical element, in particular the acquisition device is arranged outside a closed-off region of the optical assembly, which closed-off region has the at least two optical elements.

An arrangement of the acquisition device outside the closed-off region can be provided for example in the case of the position determination for adjusting the individual optical elements with respect to one another. This arrangement can be used during and after mounting.

Accordingly, a simple position determination can be realized via the optical assembly.

One variant of the disclosure furthermore includes a lithography apparatus equipped with a corresponding optical assembly.

The features described herein in connection with the optical assembly correspondingly apply to the method. Likewise, the features described in connection with the method correspondingly apply to the optical assembly.

Further possible implementations or variants of the optical assembly also include combinations—not explicitly mentioned—of features described above or below with regard to the exemplary embodiments. In this case, the person skilled in the art will also add individual aspects as improvement or supplementations in relation to the respective basic form.

Further advantageous configurations and aspects of the disclosure are the subject matter of the dependent claims and of the exemplary embodiments of the disclosure described below. The disclosure is explained in greater detail below on the basis of preferred embodiments with reference to the accompanying figures.

DETAILED DESCRIPTION

In the figures, identical or functionally identical elements have been provided with the same reference signs, unless indicated otherwise.

Figure 1:
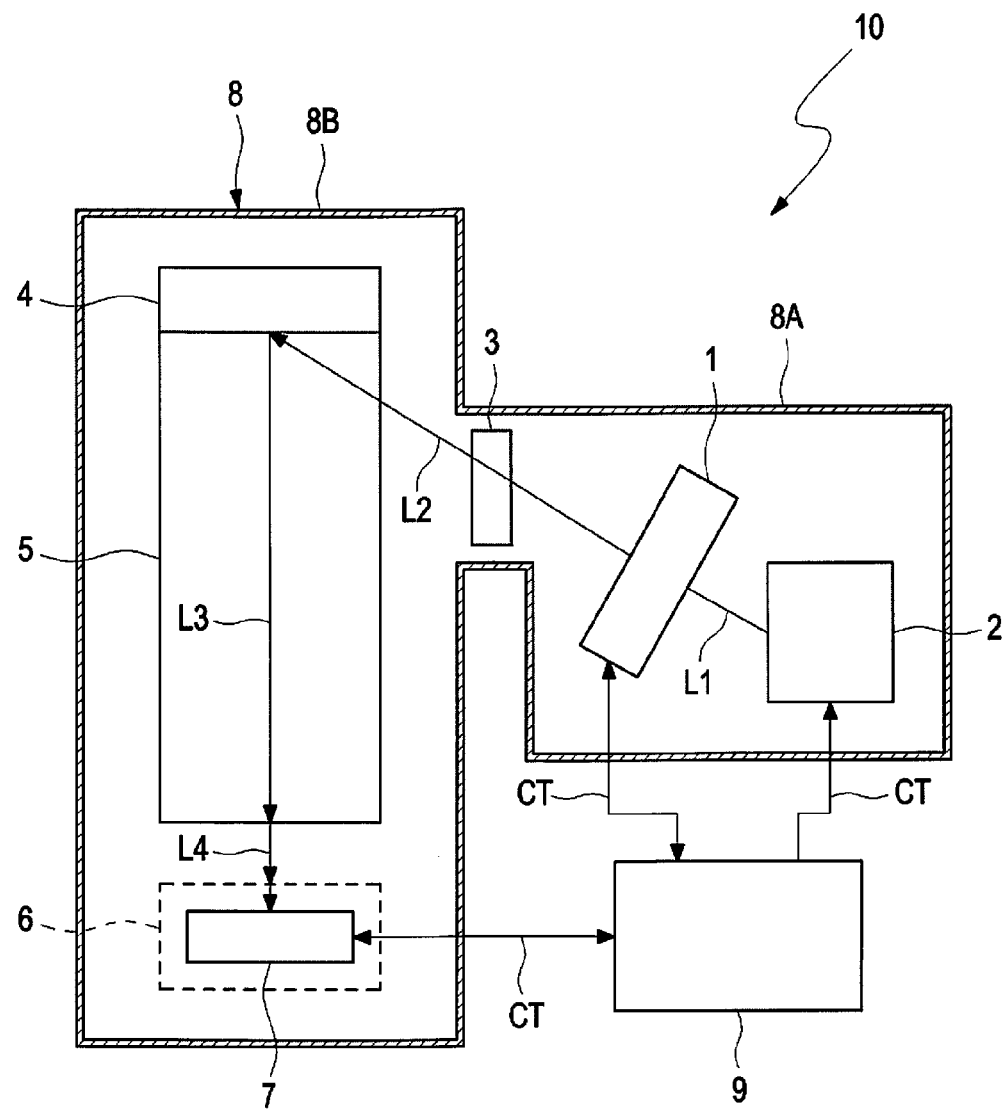
FIG. 1 shows a schematic illustration of one exemplary embodiment of a lithography apparatus.

FIG. 1 shows a schematic illustration of one exemplary embodiment of a lithography apparatus or a lithography system. The lithography apparatus 10 is illustrated schematically in cross section. Since the lithography apparatus 10 is suitable for EUV lithography, in particular, the beam path is provided completely within a vacuum chamber. FIG. 1 firstly shows the vacuum chamber 8 or a housing embodied in a vacuum-tight fashion. In this case, the device for generating light is provided in a housing part 8A on the right, in the orientation in FIG. 1, and the optical imaging system is provided in a second (left) housing part 8B.

The lithography apparatus 10 includes a radiation source 2 for generating EUV-light. Gas-discharge-excited plasmas are appropriate as radiation sources. Xenon is deemed to be a suitable target material, for example. Laser-excited plasmas as radiation sources for EUV light are also conceivable. Pulses of EUV light arise in this case. The EUV light has a wavelength of 13.5 nm, for example. In principle, a spectral range between ultraviolet and soft X-ray radiation having a wavelength of from approximately 1 nm to 100 nm can be used. Particularly efficient optical units can be produced for EUV radiation or EUV light around a wavelength of 13.5 nm.

The EUV light L1 generated by the radiation source 2 passes through a shutter device 1, which transmits the light in a pulsed fashion and thus provides EUV light L2 having a predefined pulse frequency and pulse width. The light or radiation pulses L2 pass through a debris filter 3. The debris filter 3 serves for retaining particles of any form which can originate for example from electrode fragments, vaporized material or electrons, ions or atoms imitated by the plasma of the radiation source. Despite the filter 3, particles can penetrate into the left chamber region 8B and can lead there to contaminants on the optical elements.

The left UHV chamber region 8B includes a mask station 4, which contains the masks or reticles having the patterns to be imaged for photolithography. The EUV light L3 then passes through an optical system 5, which generally includes reflective optical units for EUV radiation. From the optical system 5, the light L4 is incident on a target surface, that is to say the surface to be processed of a semiconductor wafer. In FIG. 1, the wafer station is designated by 6. The optical system 5 and the optical units or optical elements arranged therein are explained in greater detail in the following figures, in particular FIG. 8.

In order to test for example the light source 2, the reticles 4 or the imaging performance of the optical unit 5, a camera 7 is provided instead of a wafer. Furthermore, a control device 9 which can be program-controlled, for example, is provided, which receives control and sensor signals from camera 7, is communicatively coupled to the shutter device 1 and drives the radiation source 2. By way of example, the control device 9 can activate laser pulses for the plasma discharge. The control device 9 furthermore controls, for example, the shutter device 1 and radiation source 2 in such a way that well-defined EUV light pulses L2 are generated and can be acquired by the camera 7 after passing through the optical unit 5.

During the exposure of coated semiconductor wafers, a generally demagnifying imaging of the mask or reticle structures in the mask station 4 is effected by the optical system 5. In a slightly modified embodiment of the lithography apparatus 10, expedient testing and measurement of the masks used in actual wafer production can be effected. In an implementation of the lithography apparatus as a measuring and test apparatus for a light source 2, a mask (station) 4 and/or optical elements used, an optical assembly 5 is used which creates a magnifying imaging of the mask structures toward the camera 7. In order to set a suitable exposure time for the camera 7, the shutter device 1, as indicated in the introduction, is driven correspondingly.

In the alternative configuration as a measuring and test apparatus, it is not necessary to image the entire mask structure onto the target surface in the region of the wafer station 6. It may suffice to use an optical unit 5 having a small field of view which images an excerpt from the mask respectively used, as it were microscopically, toward the camera 7.

As already explained above, a precise imaging of the structures onto the wafer is involved. In order to check the desired accurate alignment of the mirrors with respect to one another, it is possible to use an optical or projection assembly 100 such as is described in the following figures. The projection assembly 100 can also be used in order to be able to check and, if appropriate, correct the optical properties of the mirrors or of other optical elements. The projection assembly 100 described below can be used in the optical system 5. Features described in connection with the projection assembly 100 can also be used for an optical assembly in the context of a device for generating light.

Figure 2:
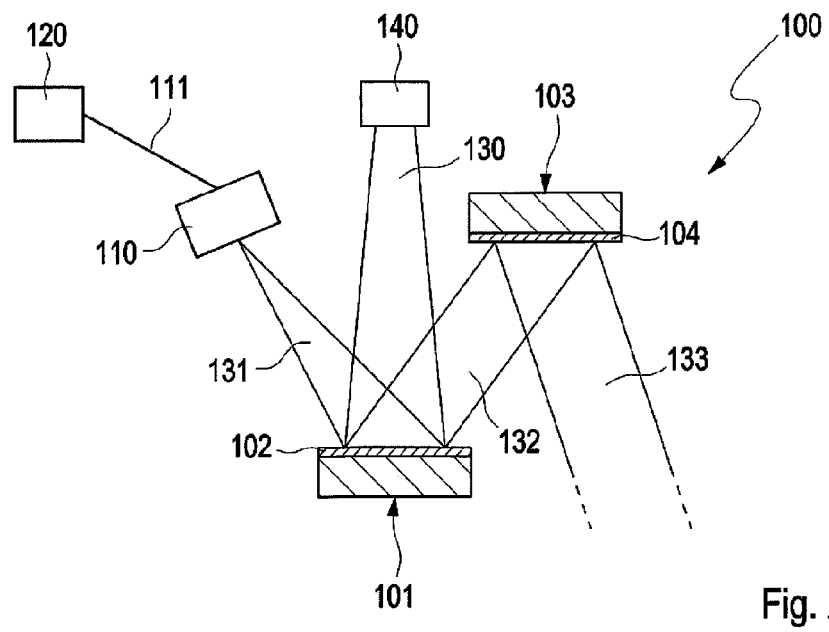
FIG. 2 shows a schematic illustration of one exemplary embodiment of a projection assembly.

FIG. 2 shows a schematic illustration of one exemplary embodiment of such a projection assembly 100. As can be seen here, the projection assembly 100 includes at least one first optical element 101, counted from the entrance of the light used for imaging, the light being generated by a light source 140, and a last optical element 103, which here is the second optical element. The light source 140 corresponds to the light generating device 1, 2, 3 in the chamber 8A from FIG. 1.

As described in FIG. 1, the optical elements 101, 103 in the projection assembly are used for imaging structures or patterns in the lithography system onto a wafer. The path of the imaging light to the wafer is indicated here by the beam paths 130, 132, wherein the beam path 133 downstream of the optical element 103 can continue to further optical elements. Each optical element 101, 103 has an optically active surface 102, 104, which can be a mirror surface, for example. Therefore, the optical elements 101, 103 are also designated hereinafter as mirrors. With the aid of these optically active regions 102, 104, the imaging light is forwarded within the beam paths 130, 132, 133 from the optical elements and between the optical elements 101, 103.

In order to determine various properties such as position, temperature or other optical properties of the optical elements 101, 103, the projection assembly 100 includes an acquisition device 110. The acquisition device 110 is arranged outside the beam path between the first optical element 101 and the last optical element 103, the beam path being indicated by the beam path 132 in FIG. 2. For determining one or a plurality of properties of the optical elements 101, 103, the acquisition device 110 acquires radiation signals 131 from one or a plurality of optical elements 101, 103. The radiation signals can include various items of information, as described below in the various embodiments. By way of example, the radiation signals can include information about a temperature distribution on the optically active regions, contaminants, position or alignment.

The acquisition device is coupled to a control device 120, which can be part of the control device 9 from FIG. 1. The coupling can be effected via an optical waveguide 111 for example. The control device 120 is designed to determine properties of the optical elements 101, 103 on the basis of the radiation signals 131 acquired by the acquisition device 110. For this purpose, the control device 120 can for example analyze the radiation signals 131, extract the information contained in the radiation signals 131 and determine the properties on the basis of the information. The control device 120 can carry out various measurement methods such as have already been explained above.

Various embodiments of the acquisition device 110 are described in the following figures. As explained below, the acquisition device 110 can acquire the radiation signals for example from the optical elements 101 or 103 or from marking elements 414, 424, which can be arranged on or at the optical elements 101, 103.

Figure 3:
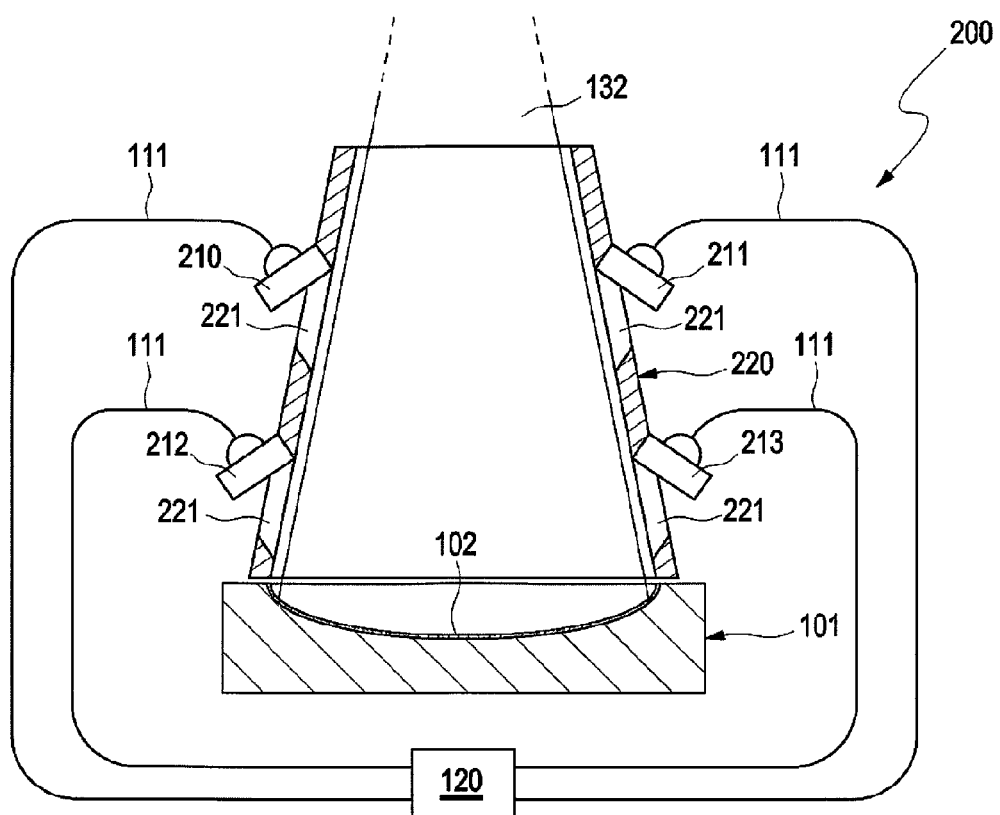
FIG. 3 shows a schematic illustration of a further exemplary embodiment of a projection assembly.

FIG. 3 shows part of a projection assembly 200. This view shows only one optical element 101, wherein this arrangement can be fitted to any optical element of the projection assembly 100. The projection assembly 200 includes a holding apparatus 220, which encompasses the beam path to and from the optical element 101 or the optically active region 102 thereof. This is also referred to as a mini-environment 220. The holding apparatus 220 can be a cooling frame, for example, which is completely or partly cooled. The holding apparatus 220 can encompass the beam path conically to a few millimeters. The holding apparatus 220 has openings 221 through which radiation signals 131 from the optical element 101 can be acquired.

The acquisition device 110 can have a plurality of sub-acquisition devices 210, 211, 212, 213. The sub-acquisition devices are fitted to the holding apparatus 220 on the outside and acquire radiation signals from the optical element 101 through the openings 221. The sub-acquisition devices 210-213 can be infrared cameras in order in each case to record an infrared image of the surface 102 of the optical element 101 from which the radiation signals proceed. The recorded light or the radiation signals are recorded by the infrared cameras 210-213 and guided via optical waveguides 111, which are mechanically and thermally decoupled from the surface 102, to a control device 120, for example a camera chip. A temperature distribution of the optical element 101 can be determined via the infrared image of the surface 102. The temperature distribution can contain information about contaminants on the surface 102 of the optical element 101, for example a mirror, or imagings of the pattern used for the exposure of the wafer.

For transferring the radiation signals 131 from the infrared cameras 210-213, for infrared signals, it is possible to use optical waveguides 111 composed of chalcogenide fibers, for example sulfide glass for wavelengths of between 2 µm and 6 µm and selenide glass for wavelengths of between 2 µm and 9 µm. EUV light can be transferred via optical waveguides 111 composed of silicon fibers.

The assembly 200 from FIG. 3 can also be used for stray light measurement. The term stray light denotes the light which does not contribute to the imaging, but rather leads only to an increased noise level in the photoresist on the wafer during the exposure. This leads to a loss of contrast. An increased stray light level can be an indication of mirror contamination. "Contamination" in this context can be contaminants or defects in the mirror surface 102 or the optically active region 102 of the optical element 101. Such contaminants can be dust particles or outgassings from materials in the system 10. During the exposure, use is usually made of DUV light, that is to say deep ultraviolet light having a wavelength of less than 300 nm (DUV: deep ultraviolet), the stray light of which impairs the imaging quality, in particular. In order to measure the stray light, DUV cameras fixed to the holding apparatus 220 are used as sub-acquisition devices 210-213.

The assembly 200 can also be used for measuring macroscopic mirror contaminations, that is to say those discernible to the eye. Furthermore, the assembly 200 can be used for measurement and for state monitoring of sensitive film elements in EUV systems, wherein the optical elements are film elements. Such film elements can be pellicles, for example, i.e. a transparent membrane composed of suitable materials. Depending on the type of radiation signals 131 to be acquired, the sub-acquisition devices 210-213 can be adapted in order to be able to acquire the corresponding wavelength, for example to a wavelength of 13.5 nm in the case of EUV light.

Figure 4:
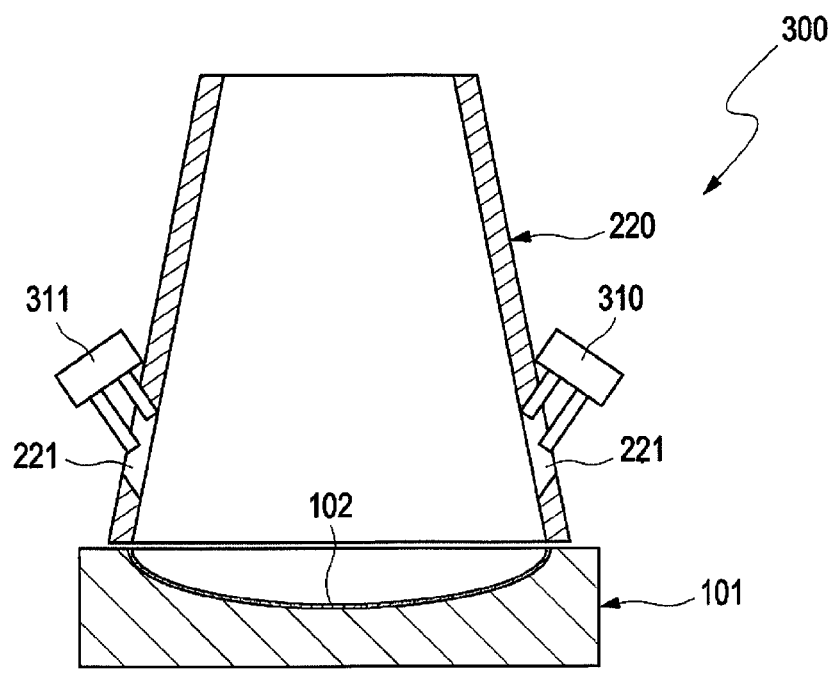
FIG. 4 shows a schematic illustration of a further exemplary embodiment of a projection assembly.

FIG. 4 shows a further exemplary embodiment of a projection assembly 300. In this exemplary embodiment, two sub-acquisition devices 310 and 311 are fixed to the holding apparatus 220. A multiplicity of sub-acquisition devices can be used in all of the embodiments.

In the embodiment shown here, the sub-acquisition devices 310, 311 are a combination of cleaning heads and cameras. Projection assemblies usually already include cleaning heads, for example hydrogen cleaning heads (HRG), which are provided in openings of the mini-environment 220. As a result, the apparatuses already present can be used for a combined component including cleaning head and camera in a simple manner. The cleaning heads 310, 311 are aligned with the optical surfaces 102, which also corresponds to the desired viewing direction of the cameras. Since very small cameras, miniaturized cameras, are used, the combination thereof with the cleaning heads 310, 311 does not necessitate new accesses. The cameras used in the cleaning heads 310, 311 can be used for temperature measurement or for stray light measurement or for measuring other optical properties.

Figure 5:
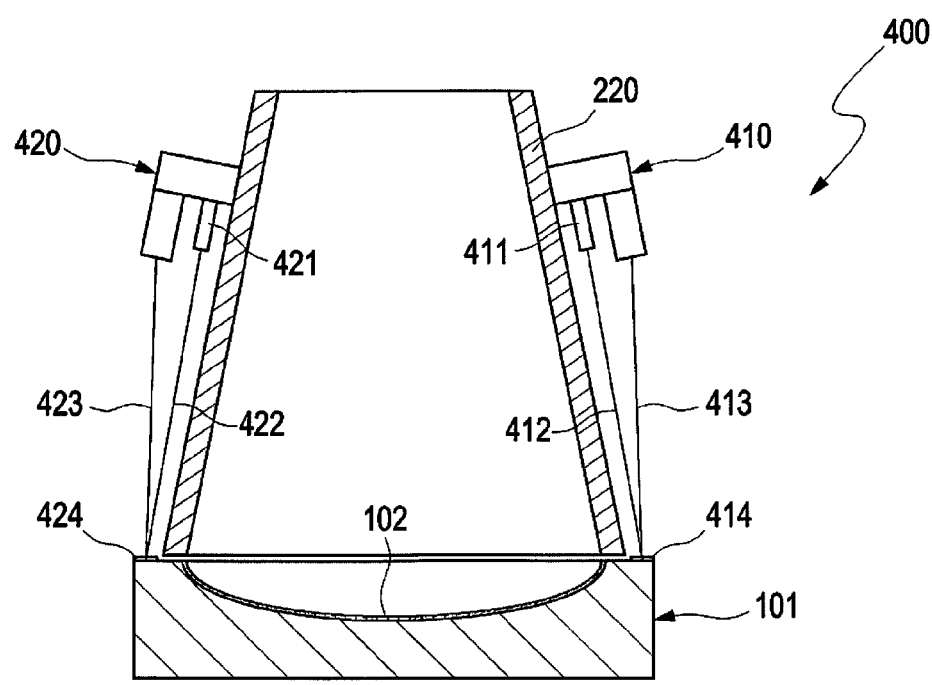
FIG. 5 shows a schematic illustration of a further exemplary embodiment of a projection assembly.

FIG. 5 shows a further exemplary embodiment of a projection assembly 400. In contrast to the assemblies 200 and 300 from FIGS. 2 and 3, the holding apparatus 220 has no openings. The cameras as sub-acquisition devices 410, 420 are arranged on the outside of the holding apparatus 220 and thus outside the beam path. Marking elements 414, 424 are fitted on the optical element 101. The marking elements 414, 424 are arranged outside the holding apparatus on the optical element 101. Three or more marking elements can be provided, even though only two are shown in this figure.

The sub-acquisition devices 410, 420 respectively have a light source 411, 421. Via the light source 411, 421, light 412, 422 is radiated onto the respective marking elements 414, 424. The marking elements 414, 424 can be reflective surfaces which reflect the light 412, 422, and the sub-acquisition devices 410, 420 receive the reflected radiation 413, 423. On the basis of the received light, a determination of the position of the optical element 101 can be carried out, for example via a light cone measurement as described above. For an initialization, that is to say initial position determination, of the mirror 102, the accuracy of the position determination can be below 10 μm, wherein the positioning takes place in relation to the mini-environment and therefore does not take account of possible deformations thereof. The light sources 411, 421 can be LED light sources or lasers or optical fiber waveguides or any other type of light source.

After the position determination and the position transfer to further sensors, not shown here, the LED light sources 411, 421 can be switched off since they are no longer required. Excessive heating of the optical element 101 by the light sources 411, 421 can be avoided in this way.

Figure 6:
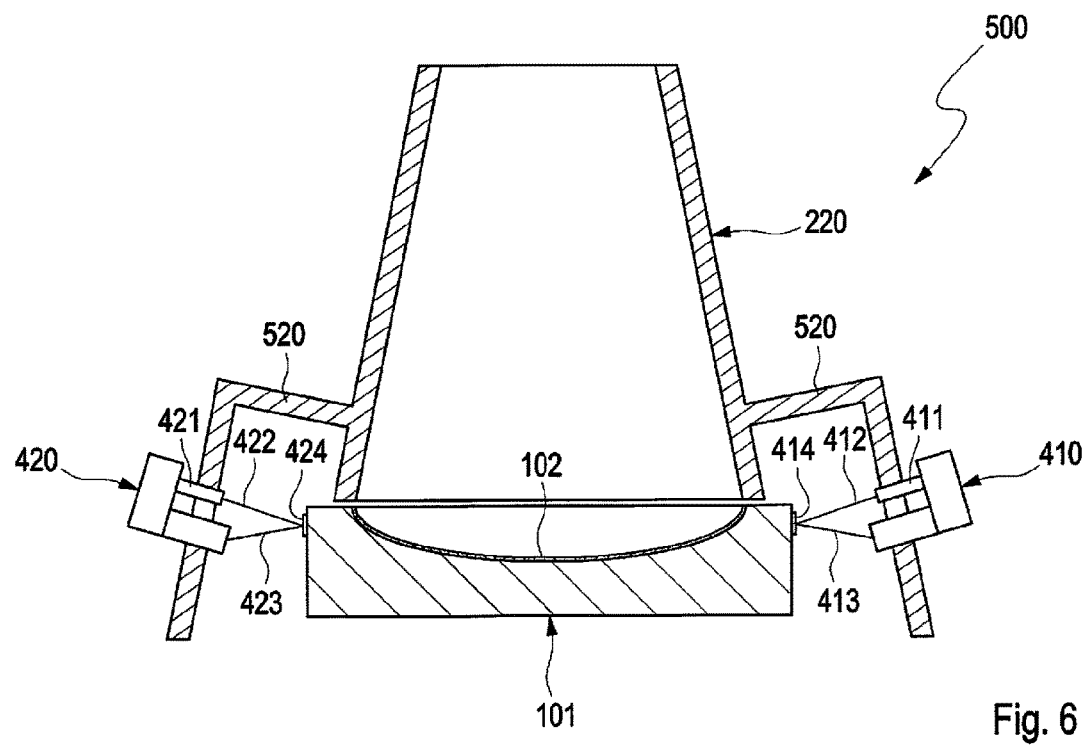
FIG. 6 shows a schematic illustration of a further exemplary embodiment of a projection assembly.

Instead of fitting the marking elements on the upper surface of the optical element 101, the marking elements 414, 424 can also be fitted to the optical element 101 laterally, as is shown in FIG. 6. In the case of the projection assembly 500, the holding apparatus 220 has lateral elements 520 to which the sub-acquisition devices 410, 420 are fixed. In this way, the light sources 411, 421 can irradiate the laterally fitted marking elements 414, 424 and the sub-acquisition devices 410, 420 can receive light from the marking elements 414, 424.

Figure 7:
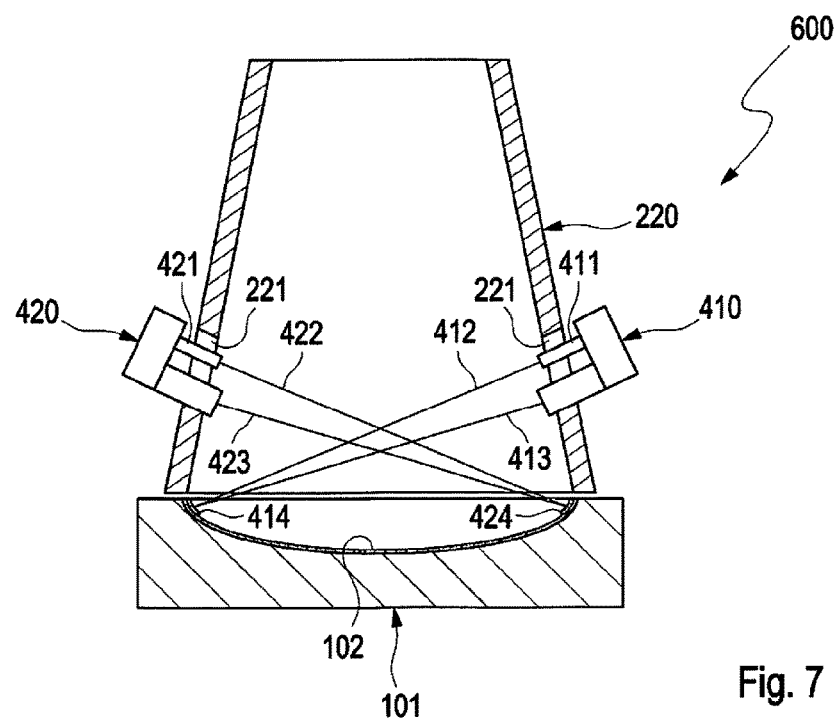
FIG. 7 shows a schematic illustration of a further exemplary embodiment of a projection assembly.

A different possibility for the arrangement of the sub-acquisition devices 410, 420 is shown in FIG. 7. In the projection assembly 600, the marking elements 414, 424 are fitted within the optically active region 102 (but outside the footprint) of the optical element 101. The sub-acquisition devices 410, 420 are arranged in such a way that they radiate light 412, 422 respectively to an opposite marking element 414, 424. The light 413, 423 reflected from the marking elements 414, 424 likewise intersects and is radiated back to the sub-acquisition devices 410, 420. In an alternative embodiment (not shown), the light 412, 422 emitted by the light sources 411, 421 does not intersect, rather only the light 413, 423 reflected from the marking elements 414, 424 intersects. As a result of the fitting of the marking elements 414, 424 for position determination at the edge of the optically used surface 102, the camera system consisting of the sub-acquisition devices 410, 420 can also be used for stray light measurement, contamination measurement and damage monitoring. Since the sub-acquisition devices 410, 420 are directed at the optically active region 102 or the mirror surface 102, the sub-acquisition devices can also carry out the measurements described in FIGS. 2 and 3. In this case, the sub-acquisition devices 410, 420 would additionally also have infrared cameras or other cameras.

In addition or as an alternative to the measurements—shown in FIGS. 2 to 6—of an individual mirror surface 102 which can be fitted on each optical element 101, 103, a measurement of an entire mirror system can be performed. In this case, position determinations for optical elements 101, 103 are carried out successively, as is shown in FIG. 8.

Figure 8:
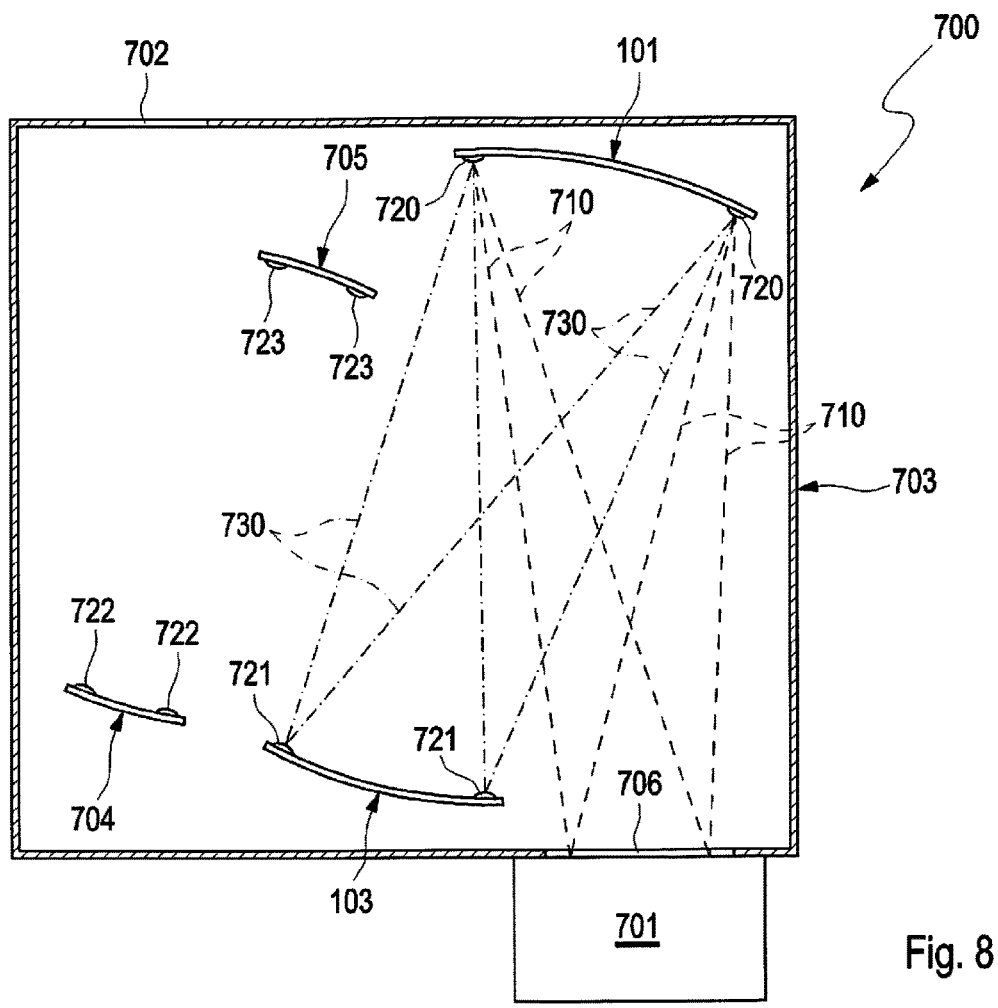
FIG. 8 shows a schematic illustration of a further exemplary embodiment of a projection assembly in a lithography system.

FIG. 8 shows a projection assembly 700. In this projection assembly, optical elements 101, 103, 704, 705 are arranged in a closed region 703 constituting a segment of the closed-off region 8 from FIG. 1. Any arbitrary number of optical elements 101, 103, 704, 705 can be used in this case. For illuminating a wafer, light is radiated in and emitted through openings 702, 706. For determining the position of or aligning the optical elements 101, 103, 704, 705, a measuring optical unit 701 can be arranged at an opening at the wafer plane. The measuring optical unit 701 can have an acquisition device 110 as described above, that is to say a camera for acquiring radiation signals 131. The measuring optical unit 701 can also be fitted at the opening 702 at the reticle plane. Each optical element 101, 103, 704, 705 has marking elements 720, 721, 722, 723. The beam path runs from the opening 706 to the optical element 101, indicated by 710, and from the optical element 101 to the optical element 103, as indicated by 730, or vice versa, since the beam path is nondirectional and only indicates a region. From the optical element 103, the beam path is implemented to the optical element 705, and from the latter in turn to the optical element 704. In order to carry out a mirror position determination, the mirrors or the optical elements 101, 103, 704, 705 are measured in order. For this purpose, the marking elements 720, 721, 722, 723 are successively switched on and off again, in order to be able to successively determine the mirror positions. That means that, in a first measurement step, the optical element 101 is measured and its marking elements 720 are activated. In a second measurement step, the optical element 103 is measured and its marking elements 721 are activated, whereas the marking elements 720 are deactivated. The activation and deactivation of the marking elements can be effected in various ways, as will be explained in greater detail in the following figures.

In the system 700 shown in FIG. 8, the mirror position determination therefore takes place as follows. Firstly, this involves determining the position of the first (image-side) optical element or mirror 101 in the beam path to the acquisition device 110 in the measuring optical unit 701, and if appropriate correcting the position. Alternatively, the object-side mirror 704 can also be used as the first mirror. Afterward, the position and alignment of the mirrors or optical elements disposed downstream in the beam path, that is to say the optical elements 103, 705, 704 (alternatively 705, 103, 101), can be determined, since the position and alignment of the previous mirror or optical element 101 are already known at this point in time of the measurement, and if appropriate were corrected. As described below, each optical element can have one or a plurality of markers or marking elements 720, 721, 722, 723, which can be active or passive. In this case, active markers or marking elements have a separate light source that applies light to them. The wavefronts or radiation signals emerging from the active marking elements 720, 721, 722, 723 are reflected from the optical elements respectively positioned beforehand in the beam path. In order to determine the position of the optical elements 103, 704, 705, it is therefore desired to take account of this forwarding of radiation signals in order to be able to correctly calculate a correction movement of the respective optical element.

The adjustment of the optical elements 101, 103, 704, 705 can also be carried out after the system has been shut down. Furthermore, a position determination or other measurements of the optical elements 101, 103, 704, 705 are also possible during operation, in order to perform a correction of the position and alignment or of other properties.

A description is given below of various types of marking elements which can be used for aligning and determining the position of the mirrors. However, these marking elements or these types of marking elements can also be used for the projection assemblies described in the previous FIGS. 4 to 6.

Figure 9:
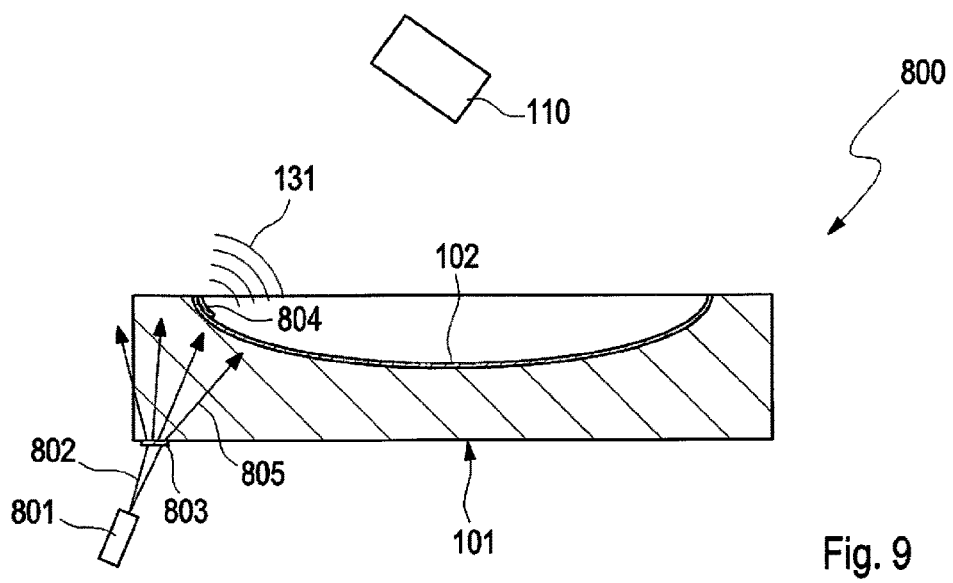
FIG. 9 shows a schematic illustration of one exemplary embodiment of an optical element with one marking element.

FIG. 9 shows a first example of a projection assembly 800 in which an optical element 101 has one marking element 720. The marking element has a light source 801, a transmissive scattering structure 803 and a diffractive structure 804. The light source 801 can be an LED light source, for example. From the light source 801, light 802 is radiated onto the transmissive scattering structure 803 fitted on the underside or rear side of the optical element 101. The light 802 passes through the scattering structure 803 as stray light 805, constituting a diffuse light distribution in the mirror body, via the main body of the optical element 101 onto the diffractive structure 804. The main body of the optical element 101 is transparent to the radiation 802.

The diffractive structure 804 is a diffraction grating, for example, which is fitted on the surface 102, and the structure can be fitted outside the footprint of the optically active region or the mirror surface 102. The diffractive structure 804 guides radiation signals 131 to the acquisition device 110. The diffractive structure 804 provides an artificial light source, the position of which is known. The scattering and diffractive structures 803, 804 can be produced for example by processing of the surface of the optical element. Instead of a combination of diffractive and scattering structures 804, 803, it is also possible to use an LED fitted on the surface 102 of the optical element 101. Such an LED or some other light source can have a size of a few micrometers and can be fitted, for example adhesively bonded, on the mirror.

The light source 801 is preferably positioned outside the main body of the optical element 101 in order to avoid thermal and mechanical input coupling. Since the light source 801 only radiates light onto the scattering element 803, a comparatively coarse positioning of the light source 801 suffices since it is not the source per se, but rather the scattering element 803 that acts as light source. The light source 801 therefore forms a primary light source and the scattering element 803 forms a secondary light source. This enables a flexible fitting of the light source 801 in the projection assembly 700. The light source 801 can be a laser or an LED-element having a suitable wavelength.

The production of the scattering structure 803 can be achieved for example by etching or particle irradiation of the optical element 101. The origin of the secondary light source formed by the scattering structure 803 is independent of the current mirror position or position of the optical element 101. The light 802 propagates almost without any losses through the main body of the optical element 101 and is incident on the diffractive structure 804. The diffractive structure 804 can be produced by electron beam processing of the mirror surface of the optical element 101. The diffractive structure can also be produced in a coated region of the optical element 101, for example in the footprint spillover 901, that is to say a region which, although it is an optically active region, is no longer included as part of the actually used region, as is also shown in FIG. 10.

Figure 10:
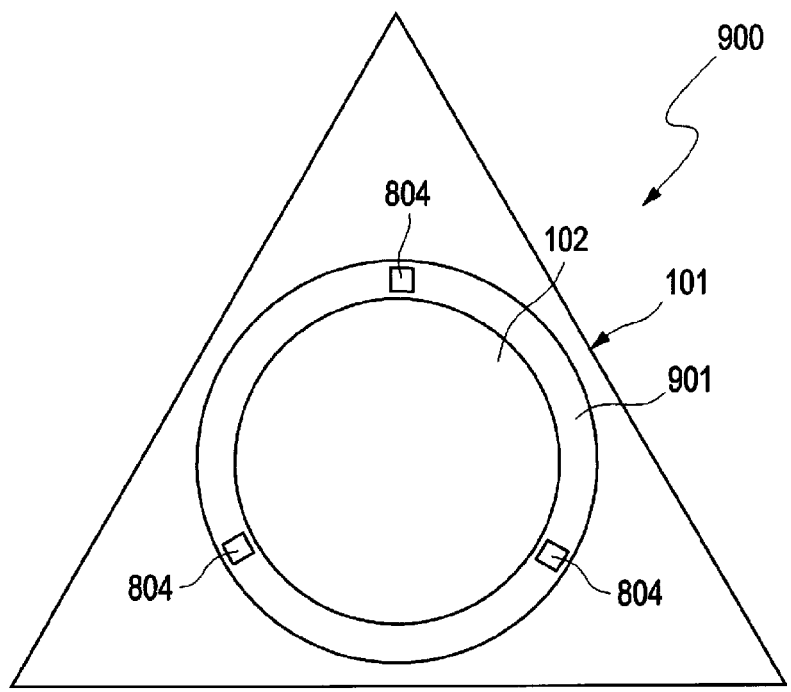
FIG. 10 shows a schematic illustration of one exemplary embodiment of an optical element with a plurality of marking elements.

As shown in the assembly 900 from FIG. 10, a plurality of diffractive structures 804, for example three, can be fitted outside the footprint or in the mirror spillover 901 of the optical element 101. The various diffractive structures 804 as marking elements can also bring about different wave shifts, as a result of which it is possible to distinguish the different marking elements. That means that the diffractive structures 804 are embodied as wavelength converters and the individual marking elements can be identified.

The marking elements 720-724 described can be used for various measurement methods for determining the position of the optical mirror surfaces 102, 104. In this regard, the light beam emitted by the marking elements 720-724 can be used as a radiation signal 131 in order, via an imaging detection, that is to say analysis of the radiation signal imaged on the camera 110, to determine the positions of the various marking elements 720-724. As already explained above, the light emitted by the marking elements 720-724 is imaged onto a camera 110 for a measurement. The control device 120 (not shown here) detects the corresponding conic section. The position of the marking elements 720-724 can be deduced from a plurality of different detected conic sections. A measurement value for the tilting of the mirror can be calculated from the evaluation of the ellipticity of the conic sections.

Figure 11:
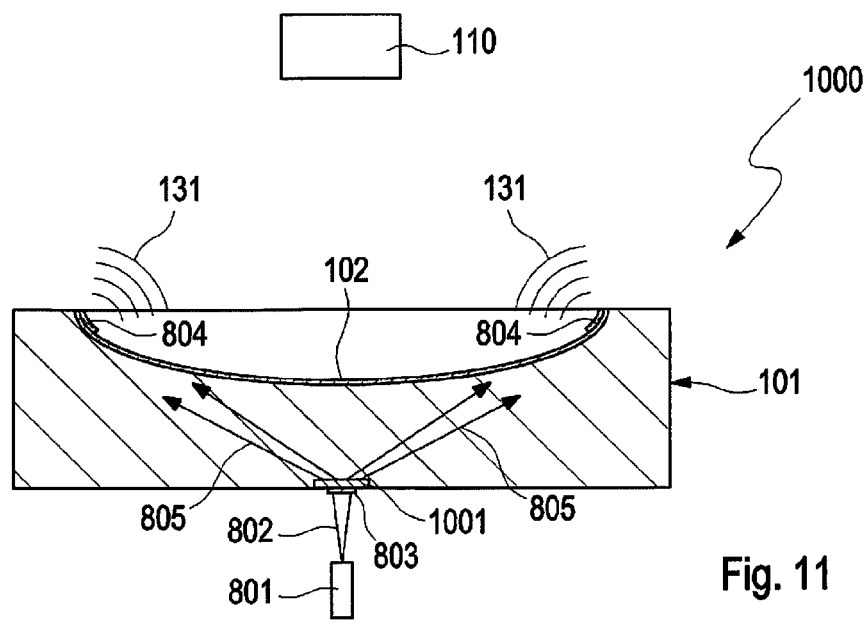
FIG. 11 shows a schematic illustration of a further exemplary embodiment of an optical element with a plurality of marking elements.

A further possibility is the time-of-flight measurement, in which the time of flight of light is measured and a position of each mirror 101, 103 is ascertained on the basis thereof. A further possibility is interferometric measurement of the position of the optical element 101. This involves determining the relative position of two marking elements 720 fitted on a surface of an optical element 101. One example of such an arrangement is shown in FIG. 11.

In the projection assembly 1000, a light source 801 irradiates a jointly used scattering structure 803. Situated directly behind the scattering structure 803 is a diffractive grating or diffractive structure 1001 having a suitably chosen grating constant in order to direct the light 802 onto two diffractive structures 804, where a diffraction pattern is generated again, such that the radiation signal 131 emitted by the two diffractive structures 804 is directed onto the camera 110, the signal interfering. The diffractive structures 804 are fitted outside the footprint of the optical surface. The camera 110 acquires the radiation signals 131, wherein the camera 110 is suitable for detecting the signals with a good spatial resolution. A spatial resolution mechanism that positions or locations on the mirror 101 are identified, wherein a good spatial resolution mechanism that the positions of the marking elements on the mirror 101 can be identified with a high resolution, that is to say that the diffractive structures 804 can be arranged near to one another.

As already explained above, the diffraction spectra generated by the diffractive structures 804 are detected for the interference measurement. The interference pattern is identified and analyzed in the camera 110 and the control device 120. The relative position of the structures and thus the absolute position of the optical element can be determined as a function of the interference pattern.

Figure 12:
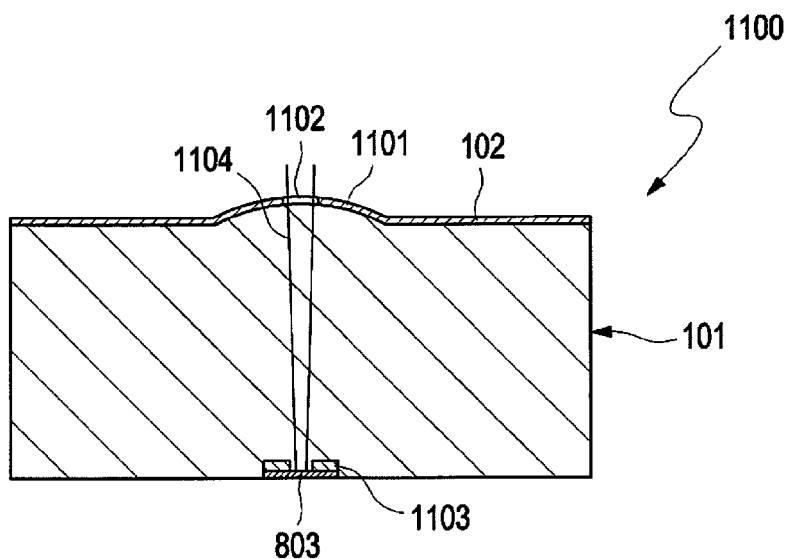
FIG. 12 shows a schematic illustration of a further exemplary embodiment of an optical element with one marking element.

A further possibility of an arrangement for a marking element 720 is shown in FIG. 12. In the case of the assembly 1100, a diffusing plate or scattering structure 803 is fitted on the underside of the optical element. A stop 1103 is fitted directly behind that, through which stop a radiation signal 1104 from the scattering structure 803 is guided through an opening 1102 upward in the direction of the optically active region 102. The opening 1102 is formed by a coating-free area of the optically active region 102. This opening 1102 acts as an aperture. This region is curved 1101 and thus functions as a refractive lens element and thus constitutes the diffractive structure 804. The optical element 101 can have a plurality of such marking elements.

As already mentioned, the marking elements described in FIGS. 9 to 11 can also be used in FIGS. 2 to 6.

The projection apparatuses described herein make it possible to determine the position and alignment of various optical elements 101, 103, 704, 705, and if appropriate to align them. Furthermore, it is also possible to ascertain other properties of the optical elements 101, 103, 704, 705 such as temperature distribution, contaminations or other properties. The use of marking elements 720-724, in particular, enables selective measurement of individual elements 101, 103, 704, 705 in the overall system 700.

Figure 13:
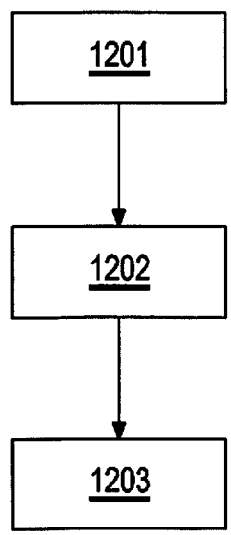
FIG. 13 shows a block diagram of one exemplary embodiment of a method for operating a projection assembly.

FIG. 13 shows an associated method for operating a projection assembly described above. In this case, a first step 1201 involves providing at least two optical elements 101, 103. The optical elements 101, 103 can have marking elements 414, 424, 720-724, as shown in FIGS. 4, 5, 6 and 8 to 11, or can have acquisition devices 110, as shown in FIGS. 2 and 3, which do not require any marking elements 414, 424, 720-724. A second step 1202 involves acquiring radiation signals from the optical elements 101, 103, 704, 705 or from marking elements 414, 424, 720-724, fixed or fitted on or at the optical elements 101, 103, 704, 705. Acquisition devices 110 such as have been described in the previous figures are used for this purpose. As explained in the previous figures, the radiation signals can include various items of information, and can include, for example, information about the temperature, position or other optical features of the optical element 101, 103, 704, 705. After the acquisition of the radiation signals 131 or of the information contained therein, properties of the optically active surface 102, 104, that is to say temperature distribution, position, alignment, contamination, etc., can be determined in a spatially resolved manner. On the basis of the properties ascertained, it is then possible, as explained above, to carry out for example an alignment of the optical element 101, 103, 704, 705 within a projection assembly.

Although the present disclosure has been described on the basis of exemplary embodiments, it can be modified in diverse ways.

LIST OF REFERENCE SIGNS 1 shutter device
2 EUV light source
3 debris filter
4 mask assembly
5 optical system
6 wafer station
7 camera
8 UHV cabinet
9 control device
10 lithography system
100 projection assembly
101 first optical element
102 optically active region
103 second/last optical element
104 optically active region
110 acquisition device
111 coupling
120 control device
130 beam path
131 radiation signals
132 beam path
133 beam path
200 part of a projection assembly
210 sub-acquisition device
211 sub-acquisition device
212 sub-acquisition device
213 sub-acquisition device
220 holding apparatus
221 opening
300 part of a projection assembly
310 cleaning head
311 cleaning head
400 part of a projection assembly
410 sub-acquisition device
411 light source
412 light
413 radiation signal
414 marking element
420 sub-acquisition device
421 light source
422 light
423 radiation signal
424 marking element
500 part of a projection assembly
520 holding apparatus projection
600 part of a projection assembly
700 projection assembly
701 measuring optical unit (with acquisition device)
702 opening
703 closed-off region
704 third optical element
705 fourth/last optical element
710 radiation signals
720 marking elements
721 marking elements
722 marking elements
723 marking elements
800 part of a projection assembly
801 light source
802 light
803 scattering structure
804 diffractive structure
900 part of a projection assembly
901 mirror spillover
1000 part of a projection assembly
1001 diffractive structure
1100 part of a projection assembly
1101 curvature of the mirror surface
1102 opening
1103 stop
1104 radiation signal
1201-1203 method steps
CT control signal
L1-L

What is claimed is:

1. An optical assembly, comprising:
first and second optical elements arranged successively in a beam path of the optical assembly;
an acquisition device configured so that, during use of the optical assembly, the acquisition device acquires radiation signals from marking elements on or at the first and second optical elements, the marking elements being outside optically active regions of the first and second optical elements, the acquisition device being outside the beam path between the first and second optical elements, the radiation signals containing information about a plurality of different properties of the optically active surfaces of the first and second optical elements; and a control device coupled to the acquisition device, the control device configured to determine the plurality of properties of the optically active surfaces of the first and second optical elements based on the information contained in the radiation signals originating from the marking elements.

2. The optical assembly of claim 1, wherein the radiation signals comprise information selected from the group consisting of spatially resolved optical information of the first and second optical elements, spatially resolved temperature information of the first and second optical elements, and position information of the first and second optical elements.

3. The optical assembly of claim 1, further comprising a holding apparatus at least partly enclosing the beam path, wherein the acquisition device is fitted to the holding apparatus outside the beam path.

4. The optical assembly of claim 3, wherein the acquisition device comprises a plurality of sub-acquisition devices fitted to the holding apparatus outside the beam path.

5. The optical assembly of claim 3, wherein the holding apparatus is configured to have cooled regions.

6. The optical assembly of claim 4, wherein the holding apparatus has openings through which the sub-acquisition devices acquire radiation signals from the respective optical element and/or from marking elements on the respective optical element.

7. The optical assembly of claim 4, wherein the sub-acquisition devices are outside the beam paths between the optically active regions of the first and second optical elements.

8. The optical assembly of claim 4, wherein the sub-acquisition devices are fitted to at least one cleaning head.

9. The optical assembly of claim 8, wherein the at least one cleaning head comprises at least one hydrogen cleaning head.

10. The optical assembly of claim 1, wherein the acquisition device comprises at least one member selected from the group consisting of a camera, an optical waveguide configured to acquire and/or forward the radiation signals.

11. The optical assembly of claim 1, wherein the acquisition device is designed to acquire radiation signals in the infrared range.

12. The optical assembly of claim 1, wherein each of the first and second optical elements have at least one marking element, wherein the marking elements are configured to emit the radiation signals.

13. The optical assembly of claim 1, wherein each of the marking elements comprises a structure selected from the group consisting of a diffractive structure, a scattering structure, and a reflective structure.

14. The optical assembly of claim 1, wherein the acquisition device comprises a light source configured to illuminate the marking elements, and the acquisition device is configured to receive a radiation signal emerging from the marking elements.

15. The optical assembly of claim 1, wherein the control device is coupled to the marking elements.

16. The optical assembly of claim 1, wherein the acquisition device comprises at least two sub-acquisition devices with a light source, wherein the radiation signals emerging from the light sources cross one another and respectively irradiate marking elements of an optical element.

17. The optical assembly of claim 1, wherein the first optical element comprises at least two marking elements.

18. The optical assembly of claim 17, wherein the at least two marking elements are configured to produce different wave shifts of the incident light.

19. The optical assembly of claim 17, wherein the at least two marking elements are configured so that the radiation signals output by the at least two marking elements interfere with each other.

20. The optical assembly of claim 19, wherein:
the at least two marking elements comprise a jointly used scattering structure and a jointly used diffractive structure;
each of the at least two marking elements comprises an individually used diffractive structure;
the optical assembly is configured so that radiation signals are transferred from the jointly used scattering structure to the jointly used diffractive structure;
the jointly used diffractive structure is configured to transfer the radiation signals in each case to one of the individually used diffractive structures.

21. The optical assembly of claim 20, wherein the optical assembly is configured so that, during use of the optical assembly, the jointly used scattering structure is irradiated by a light source.

22. The optical assembly of claim 1, wherein each of the marking elements comprises a scattering structure and a diffractive structure, the scattering structure is on an underside of the respective optical element, the diffractive structure is on that side of the optically used region of the optical element which is situated opposite the underside, and the optical assembly is configured so that radiation signals are transferred from the scattering structure to the diffractive structure through the optical element.

23. The optical assembly of claim 1, wherein a marking element has a scattering structure and a stop, the optical assembly is configured so that radiation signals are directed through the scattering structure and the stop onto a coating-free region of the respective optical element.

24. The optical assembly of claim 22, wherein the diffractive structure is in a mirror surface of the optical element.

25. The optical assembly of claim 24, wherein the mirror surface is locally curved to define a lens.

26. The optical assembly of claim 1, wherein the acquisition device is configured to acquire radiation signals having a wavelength of between 193 nm and 1450 nm.

27. The optical assembly of claim 1, wherein the marking element comprises a light source.

28. The optical assembly of claim 1, wherein the marking elements are configured to be switched on and/or off.

29. The optical assembly of claim 1, wherein the acquisition device is arranged in the beam path to the first optical element, or the acquisition device is arranged in the beam path from the second optical element.

30. A method, comprising:
providing the optical assembly of claim 1;
acquiring radiation signals from the marking elements, the radiation signals comprising information about a plurality of properties of an optically active surface of the at least two optical elements; and
determining the plurality of properties of the optically active surface of the first and second optical elements based on the information contained in the radiation signals.

31. The method of claim 30, further comprising positioning the first and second optical elements, wherein the optically active surfaces of the first and second optical elements are aligned relative to each other, and the positioning of the first and second optical elements takes place progressively.

\* \* \* \* \*

UNITED STATES PATENT AND TRADEMARK OFFICE
CERTIFICATE OF CORRECTION

PATENT NO. : 9,939,730 B2
APPLICATION NO. : 14/962149
DATED : April 10, 2018
INVENTOR(S) : Walter Pauls et al.

It is certified that error appears in the above-identified patent and that said Letters Patent is hereby corrected as shown below:

In the Specification

Column 1, Line 44-45, delete "The wafer coated with photoresist is exposed by an exposure apparatus, which can likewise be an optical assembly. In this case, a pattern of structures that is produced on a mask or a reticle is imaged onto the photoresist with the aid of a projection lens. Reflective optical units, for example, are used for this purpose. After the photoresist has been developed, the wafer is subjected to chemical processes, as a result of which the surface of the wafer is structured in accordance with the pattern on the mask. Further steps can follow until all layers have been applied to the wafer for forming the semiconductor structure." and insert the same at Column 1, Line 45, as a new paragraph.

Signed and Sealed this
Twenty-eighth Day of August, 2018

Andrei Iancu
*Director of the United States Patent and Trademark Office*